(12) United States Patent
Aoki et al.

(10) Patent No.: US 11,251,048 B2
(45) Date of Patent: Feb. 15, 2022

(54) PLASMA PROCESSING METHOD AND PLASMA PROCESSING APPARATUS

(71) Applicant: Tokyo Electron Limited, Tokyo (JP)

(72) Inventors: Yusuke Aoki, Miyagi (JP); Toshikatsu Tobana, Miyagi (JP); Fumiya Takata, Miyagi (JP); Shinya Morikita, Miyagi (JP); Kazunobu Fujiwara, Miyagi (JP); Jun Abe, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/896,304

(22) Filed: Jun. 9, 2020

(65) Prior Publication Data

US 2020/0402805 A1    Dec. 24, 2020

(30) Foreign Application Priority Data

Jun. 18, 2019  (JP) .............................. JP2019-112618

(51) Int. Cl.
| | |
|---|---|
| *H01J 37/32* | (2006.01) |
| *H01L 21/3065* | (2006.01) |
| *H01L 21/02* | (2006.01) |
| *H05H 1/24* | (2006.01) |
| *C23C 16/44* | (2006.01) |

(52) U.S. Cl.
CPC ...... *H01L 21/3065* (2013.01); *C23C 16/4405* (2013.01); *H01J 37/3244* (2013.01); *H01J 37/32082* (2013.01); *H01J 37/32477* (2013.01); *H01L 21/02115* (2013.01);
(Continued)

(58) Field of Classification Search
CPC ............ C23C 16/4405; C23C 16/4404; C23C 16/401; C23C 16/503; C23C 16/505; H01J 2237/335; H01J 37/32082; H01J 37/3244; H01J 37/32477; H01J 37/32146; H01J 37/32091; H01L 21/02115; H01L 21/02123; H01L 21/3065; H01L 21/6831; H05H 1/24
USPC ....... 438/706, 710, 712, 714, 717, 719, 723, 438/736, 750; 156/345.44, 345.45, 156/345.47, 345.48
See application file for complete search history.

(56) References Cited

U.S. PATENT DOCUMENTS 10,727,075 B2 * 7/2020 Kim .................. H01L 21/31144
2014/0087092 A1 * 3/2014 Nieh ....................... C23C 14/34
427/569
(Continued)

FOREIGN PATENT DOCUMENTS

| JP | 2014-138027 A | 7/2014 |
|---|---|---|
| JP | 2016-012712 A | 1/2016 |

*Primary Examiner* — Lan Vinh
(74) *Attorney, Agent, or Firm* — Studebaker & Brackett PC (57) ABSTRACT

A plasma processing method according to an exemplary embodiment includes generating plasma from a film formation gas in a chamber of a plasma processing apparatus by supplying radio frequency power from a radio frequency power source. The plasma processing method further includes forming a protective film on an inner wall surface of a side wall of the chamber by depositing a chemical species from the plasma on the inner wall surface. In the forming a protective film, a pulsed negative direct-current voltage is periodically applied from a direct-current power source device to an upper electrode of the plasma processing apparatus.

19 Claims, 5 Drawing Sheets

(52) U.S. Cl.
CPC ......... *H01L 21/02123* (2013.01); *H05H 1/24* (2013.01); *H01J 2237/335* (2013.01)

(56) References Cited

U.S. PATENT DOCUMENTS

2014/0326409 A1* 11/2014 Koshiishi .......... H01J 37/32706
    156/345.29
2017/0365450 A1* 12/2017 Bi ..................... H01J 37/32862

* cited by examiner

PLASMA PROCESSING METHOD AND PLASMA PROCESSING APPARATUS

CROSS-REFERENCE TO RELATED APPLICATIONS

This application is based on and claims the benefit of priority from Japanese Patent Application No. 2019-112618 filed on Jun. 18, 2019, the entire contents of which are incorporated herein by reference.

FIELD

Exemplary embodiments of the present disclosure relate to a plasma processing method and a plasma processing apparatus.

BACKGROUND

A plasma processing apparatus is used for plasma processing on a substrate. A protective film is formed on the inner wall surface of a chamber of a plasma processing apparatus before performing plasma processing on a substrate in some cases. Japanese Patent Application Laid-Open Publication No. 2014-138027 and Japanese Patent Application Laid-Open Publication No. 2016-12712 disclose techniques for forming a protective film on the inner wall surface of a chamber. In the technique disclosed in each of these literatures, plasma of a silicon-containing gas is generated in the chamber in order to form a protective film on the inner wall surface of the chamber.

SUMMARY

In an exemplary embodiment, a plasma processing method is provided. The plasma processing method is performed using a plasma processing apparatus. The plasma processing apparatus includes a chamber, a substrate support, an upper electrode, a radio frequency power source, and a direct-current power source device. The chamber includes a side wall having an inner wall surface. The substrate support includes a lower electrode provided in the chamber. The upper electrode is provided above the substrate support. The radio frequency power source is used to generate plasma in the chamber. The direct-current power source device is electrically connected to the upper electrode. The direct-current power source device is configured to periodically generate a pulsed negative direct-current voltage. The plasma processing method includes generating plasma from a film formation gas in the chamber by supplying radio frequency power from the radio frequency power source. The plasma processing method further includes forming a protective film on the inner wall surface by depositing the chemical species from the plasma on the inner wall surface. In the forming a protective film, the pulsed negative direct-current voltage is periodically applied from the direct-current power source device to the upper electrode.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing method is provided. The plasma processing method is performed using a plasma processing apparatus. The plasma processing apparatus includes a chamber, a substrate support, an upper electrode, a radio frequency power source, and a direct-current power source device. The chamber includes a side wall having an inner wall surface. The substrate support includes a lower electrode provided in the chamber. The upper electrode is provided above the substrate support. The radio frequency power source is used to generate plasma in the chamber. The direct-current power source device is electrically connected to the upper electrode. The direct-current power source device is configured to periodically generate a pulsed negative direct-current voltage. The plasma processing method includes generating plasma from a film formation gas in the chamber by supplying radio frequency power from the radio frequency power source. The plasma processing method further includes forming a protective film on the inner wall surface by depositing the chemical species from the plasma on the inner wall surface. In the forming a protective film, the pulsed negative direct-current voltage is periodically applied from the direct-current power source device to the upper electrode.

In the above embodiment, a raw material in the plasma formed from the film formation gas forms the protective film on the surface of the upper electrode and the inner wall surface of the side wall of the chamber. Since the pulsed negative direct-current voltage is periodically applied to the upper electrode when the protective film is formed, ion sputtering occurs on the protective film formed on the surface of the upper electrode. As a result, an increase in the thickness of the protective film formed on the surface of the upper electrode is suppressed. On the other hand, the thickness of the protective film which is formed on the inner wall surface of the side wall of the chamber is adjusted according to the effective value of the voltage which is applied from the direct-current power source device to the upper electrode when the protective film is formed. Therefore, according to the above embodiment, it becomes possible to control the thickness of the protective film which is formed on the inner wall surface of the side wall of the chamber, while suppressing an increase in the thickness of the protective film which is formed on the upper electrode of a capacitively coupled plasma processing apparatus.

In an exemplary embodiment, the film formation gas may include a silicon-containing gas. In an exemplary embodiment, the silicon-containing gas may be a silicon halide gas. In an exemplary embodiment, the silicon halide gas may be a silicon tetrachloride gas. In an exemplary embodiment, the film formation gas may include a carbon-containing gas. In an exemplary embodiment, the carbon-containing gas may be a hydrocarbon gas or a fluorocarbon gas.

In an exemplary embodiment, an output voltage of the direct-current power source device may be a pulsed negative direct-current voltage in a first period within a cycle and be zero volts in a second period remaining within the cycle.

In an exemplary embodiment, the effective value of the output voltage of the direct-current power source device in the forming a protective film may be smaller than 0 V and equal to or larger than −848 V. The effective value is the product of the square root of a duty ratio and the value of the pulsed negative direct-current voltage in the first period. The duty ratio is the ratio of the time length of the first period to the time length of the cycle.

In an exemplary embodiment, the plasma processing method may further include performing plasma processing of a substrate in the chamber after the forming a protective film. In the performing plasma processing, plasma is generated from a processing gas in the chamber by supplying radio frequency power from the radio frequency power source. In the performing plasma processing, the effective value of the output voltage of the direct-current power source device is set to a value smaller than the effective value in the forming a protective film. In the performing plasma processing, the substrate is processed by a chemical species from the plasma generated from the processing gas.

In an exemplary embodiment, the plasma processing method may further include removing the protective film. In the removing the protective film, plasma is generated from a cleaning gas in the chamber by supplying radio frequency power from the radio frequency power source. In the removing the protective film, the effective value of the output voltage of the direct-current power source device is set to a value larger than the effective value in the forming a protective film. In the removing the protective film, the protective film is processed by a chemical species from the plasma generated from the cleaning gas.

In another exemplary embodiment, a plasma processing apparatus is provided. The plasma processing apparatus includes a chamber, a substrate support, an upper electrode, a radio frequency power source, a direct-current power source device, and a controller. The chamber includes a side wall having an inner wall surface. The substrate support includes a lower electrode provided in the chamber. The upper electrode is provided above the substrate support. The radio frequency power source is used to generate plasma in the chamber. The direct-current power source device is electrically connected to the upper electrode. The controller is configured to control the radio frequency power source and the direct-current power source device. The direct-current power source device is configured to periodically generate a pulsed negative direct-current voltage. The controller is configured to control the radio frequency power source to supply radio frequency power to generate plasma from a film formation gas in the chamber. The controller is configured to control the direct-current power source device to periodically apply the pulsed negative direct-current voltage to the upper electrode to form a protective film on the inner wall surface by depositing the chemical species from the plasma on the inner wall surface.

In an exemplary embodiment, the film formation gas may include a silicon-containing gas. In an exemplary embodiment, the silicon-containing gas may be a silicon halide gas. In an exemplary embodiment, the silicon halide gas may be a silicon tetrachloride gas. In an exemplary embodiment, the film formation gas may include a carbon-containing gas. In an exemplary embodiment, the carbon-containing gas may be a hydrocarbon gas or a fluorocarbon gas.

In an exemplary embodiment, an output voltage of the direct-current power source device may be a pulsed negative direct-current voltage in a first period within a cycle and be zero volts in a second period remaining within the cycle.

In an exemplary embodiment, the controller may be configured to control the direct-current power source device to set the effective value of the output voltage to a value smaller than 0 V and equal to or larger than −848 V when forming a protective film. The effective value is the product of the square root of a duty ratio and the value of the pulsed negative direct-current voltage in the first period. The duty ratio is the ratio of the time length of the first period to the time length of the cycle.

In an exemplary embodiment, the controller may be configured to control the radio frequency power source to supply radio frequency power to generate plasma from a processing gas in the chamber when performing plasma processing of the substrate in the chamber after the formation of the protective film. The controller may be configured to control the direct-current power source device to set the effective value of the output voltage of the direct-current power source device to a value smaller than the effective value set at the time of the formation of the protective film, when performing the plasma processing of the substrate.

In an exemplary embodiment, the controller may be configured to control the radio frequency power source to supply radio frequency power to generate plasma from the cleaning gas in the chamber when removing the protective film. The controller may control the direct-current power source device to set the effective value of the output voltage of the direct-current power source device to a value larger than the effective value set at the time of the formation of the protective film, when removing the protective film.

Hereinafter, various embodiments will be described in detail with reference to the drawings. In the drawing, the same or equivalent portions are denoted by the same reference symbols.

Figure 1:
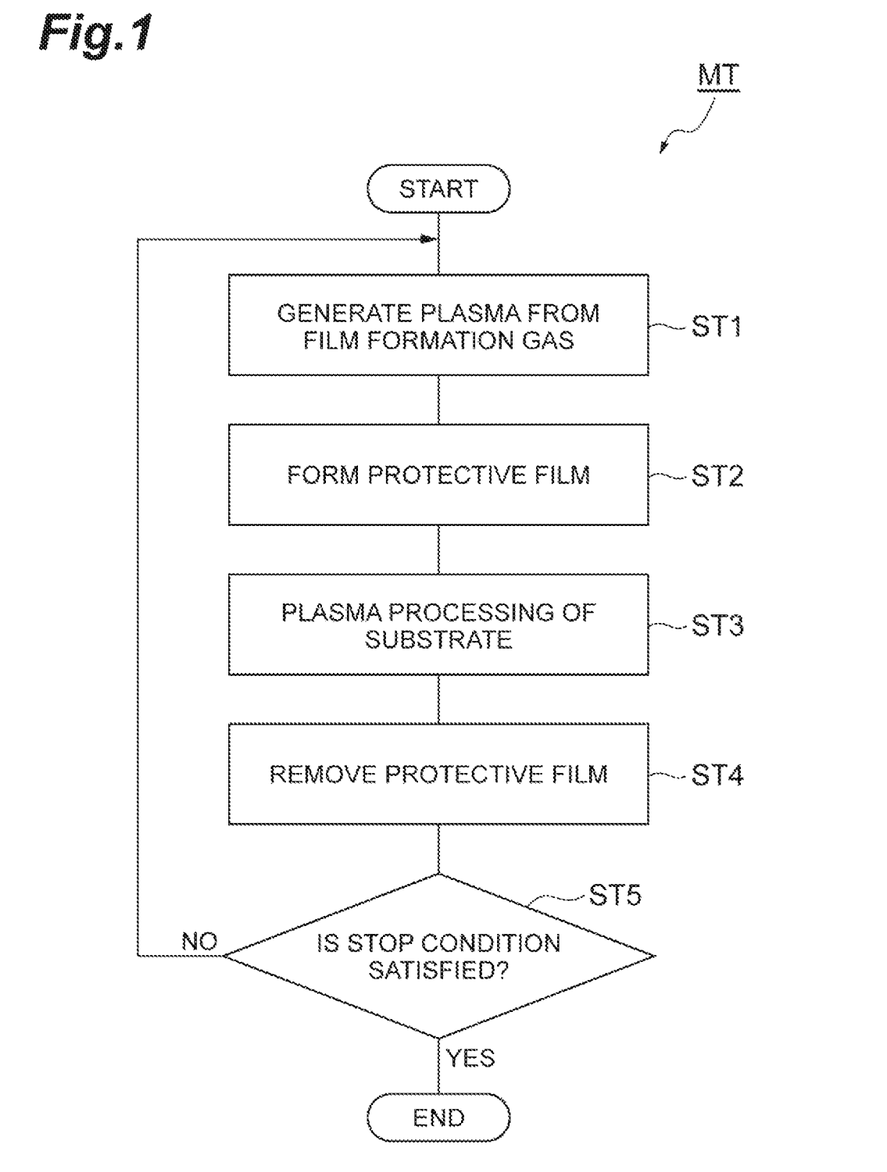
FIG. 1 is a flowchart of a plasma processing method according to an exemplary embodiment.
Figure 2:
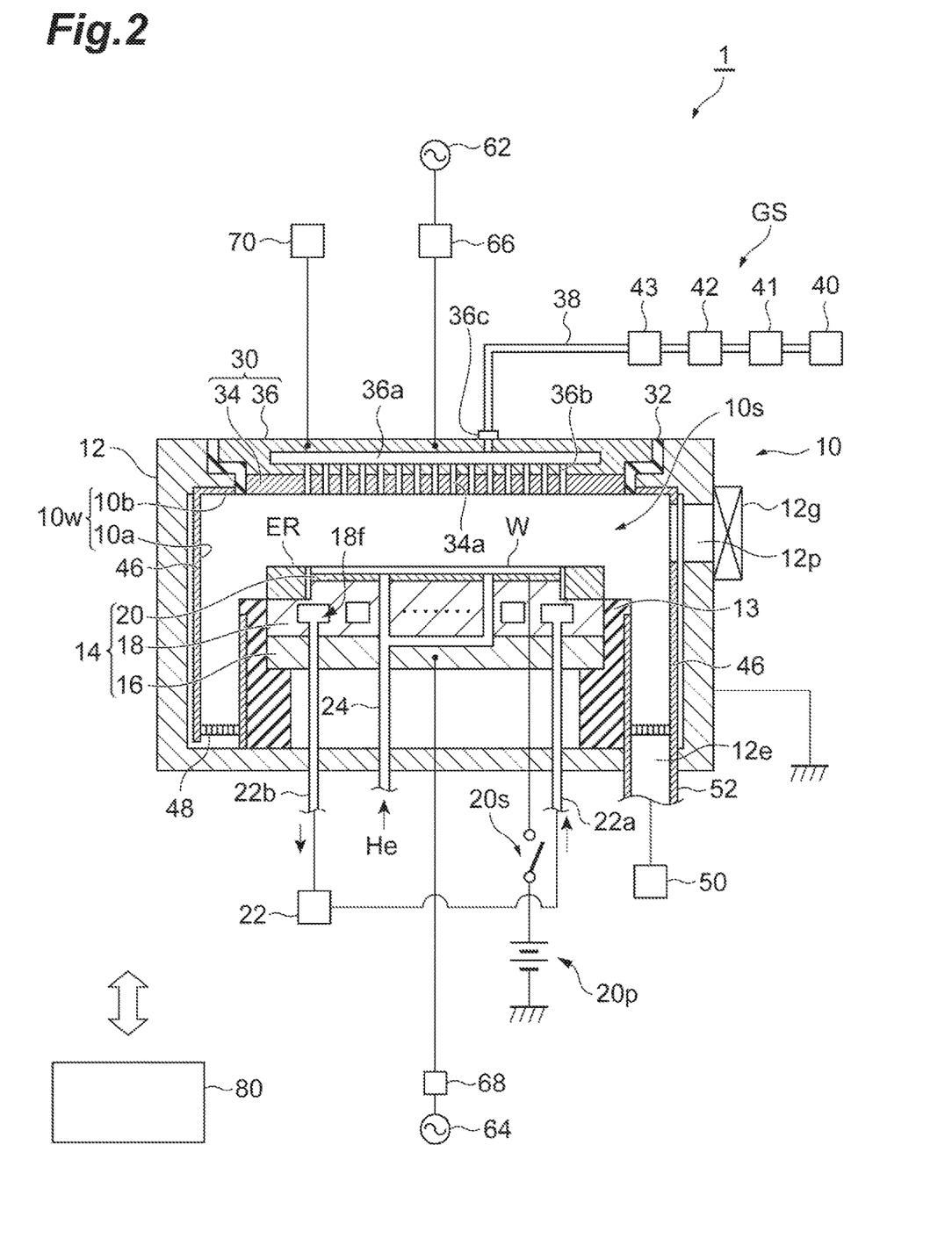
FIG. 2 schematically illustrates a plasma processing apparatus according to an exemplary embodiment.

FIG. 1 is a flowchart of a plasma processing method according to an exemplary embodiment. The plasma processing method (hereinafter referred to as a "method MT") shown in FIG. 1 is performed using a capacitively coupled plasma processing apparatus. FIG. 2 schematically illustrates a plasma processing apparatus according to an exemplary embodiment. A plasma processing apparatus 1 shown in FIG. 2 is a capacitively coupled plasma processing apparatus. The plasma processing apparatus 1 may be used in performing the method MT.

The plasma processing apparatus 1 is provided with a chamber 10. The chamber 10 provides an internal space 10s therein. The chamber 10 includes a chamber body 12. The chamber body 12 has a substantially cylindrical shape. The internal space 10s is provided inside the chamber body 12. The chamber body 12 is formed of a conductor such as aluminum. The chamber body 12 is grounded. A film having corrosion resistance is applied to the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is configured to be able to be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the chamber 10, that is, in the internal space 10s.

The substrate support 14 includes a lower electrode 18 and an electrostatic chuck 20. The lower electrode 18 and the electrostatic chuck 20 are provided in the chamber 10. The substrate support 14 may further include an electrode plate 16. The electrode plate 16 is formed of a conductor such as aluminum, for example, and has a substantially disk shape. The lower electrode 18 is provided on the electrode plate 16. The lower electrode 18 is formed of a conductor such as aluminum, for example, and has a substantially disk shape. The lower electrode 18 is electrically connected to the electrode plate 16.

The electrostatic chuck 20 is provided on the lower electrode 18. The substrate W is placed on an upper surface of the electrostatic chuck 20. The electrostatic chuck 20 has a main body and an electrode. The main body of the electrostatic chuck 20 is formed of a dielectric. The electrode of the electrostatic chuck 20 is an electrode having a film shape and is provided in the main body of the electrostatic chuck 20. The electrode of the electrostatic chuck 20 is connected to a direct-current power source 20p through a switch 20s. When the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

An edge ring ER is disposed on the substrate support 14. The edge ring ER may be formed of silicon, silicon carbide, or quartz, but not limited thereto. When processing of the substrate W is performed in the chamber 10, the substrate W is disposed on the electrostatic chuck 20 and in a region surrounded by the edge ring ER.

A flow path 18f is provided in the interior of the lower electrode 18. A heat exchange medium (for example, a refrigerant) is supplied from a chiller unit 22 to the flow path 18f through a pipe 22a. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

The plasma processing apparatus 1 may be further provided with a gas supply line 24. The gas supply line 24 supplies a heat transfer gas (for example, He gas) to a gap between the upper surface of the electrostatic chuck 20 and the back surface of the substrate W. The heat transfer gas is supplied from a heat transfer gas supply mechanism to the gas supply line 24.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 is formed of a silicon-containing material. The ceiling plate 34 is formed of, for example, silicon or silicon carbide. A plurality of gas discharge holes 34a are formed in the ceiling plate 34. The plurality of gas discharge holes 34a penetrate the ceiling plate 34 in a plate thickness direction thereof.

The support 36 detachably supports the ceiling plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b respectively communicate with the plurality of gas discharge holes 34a. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit GS. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents a byproduct of plasma processing from adhering to the chamber body 12. The shield 46 is grounded. The shield 46 is configured, for example, by forming a film having corrosion resistance on a surface of a member formed of aluminum. The film having corrosion resistance may be a film formed of ceramic such as yttrium oxide. In an embodiment, the shield 46 provides an inner wall surface 10w which the chamber 10 has. The inner wall surface 10w includes a first region 10a and a second region 10b. The first region 10a extends on the side of the internal space 10s. The second region 10b extends above the internal space 10s and on the side of the upper electrode 30. The first region 10a and the second region 10b may be provided by another member, for example the chamber body 12, instead of the shield 46.

A baffle plate 48 is provided between the support 13 and the side wall of the chamber body 12. The baffle plate 48 is configured, for example, by forming a film having corrosion resistance on a surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a first radio frequency power source 62 and a second radio frequency power source 64. The first radio frequency power source 62 is a power source configured to generate first radio frequency power. In an example, the first radio frequency power has a frequency suitable for the generation of a plasma. The frequency of the first radio frequency power is, for example, a frequency in a range of 27 MHz to 100 MHz. The first radio frequency power source 62 is connected to the upper electrode 30 through a matcher 66. The matcher 66 has a circuit configured to match the impedance on the load side (the upper electrode 30 side) of the first radio frequency power source 62 with the output impedance of the first radio frequency power source 62. The first radio frequency power source 62 may be connected to the lower electrode 18 through the matcher 66 and the electrode plate 16.

The second radio frequency power source 64 is a power source configured to generate second radio frequency power. The second radio frequency power has a frequency lower than the frequency of the first radio frequency power. The second radio frequency power may be used as bias radio frequency power for attracting ions to the substrate W. The frequency of the second radio frequency power is, for example, a frequency in a range of 400 kHz to 40 MHz. The second radio frequency power source 64 is connected to the lower electrode 18 through a matcher 68 and the electrode plate 16. The matcher 68 has a circuit configured to match the impedance on the load side (the lower electrode 18 side) of the second radio frequency power source 64 with the output impedance of the second radio frequency power source 64.

Figure 3:
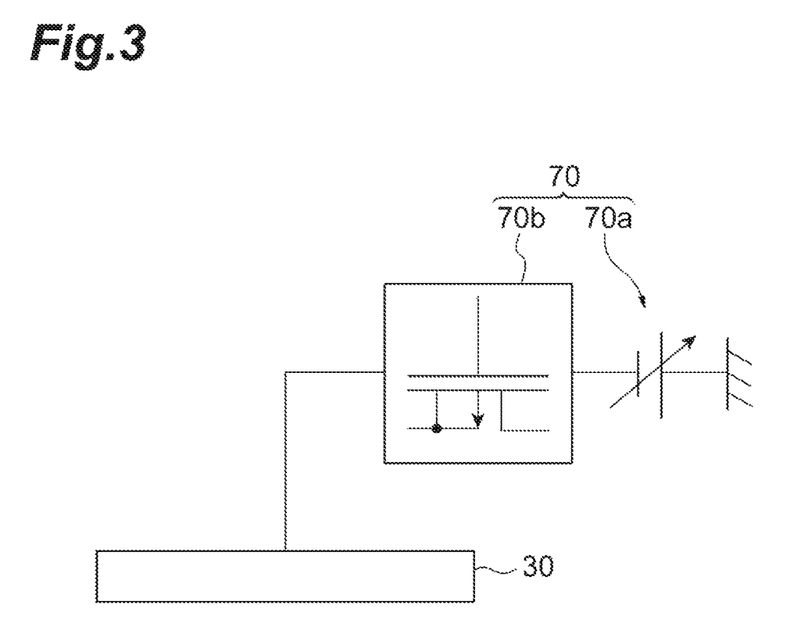
FIG. 3 illustrates an example of a configuration of a direct-current power source device of the plasma processing apparatus shown in FIG. 2.
Figure 4:
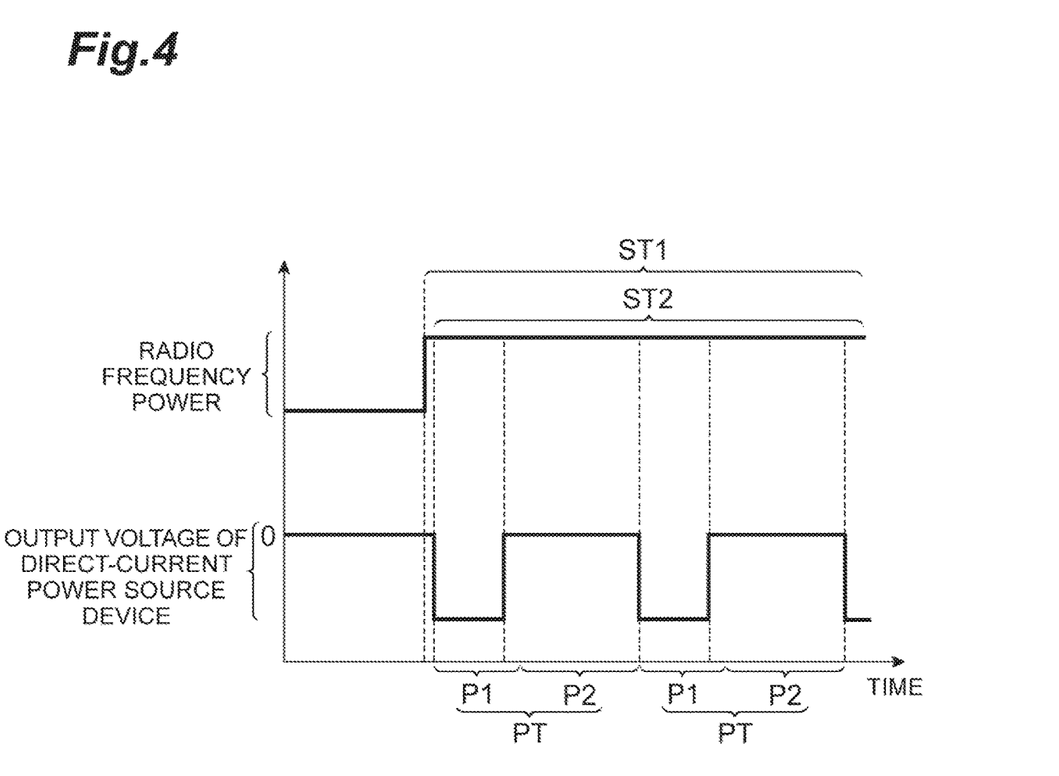
FIG. 4 is a timing chart related to the plasma processing method according to an exemplary embodiment.

The plasma processing apparatus 1 further includes a direct-current power source device 70. The direct-current power source device 70 is electrically connected to the upper electrode 30. The direct-current power source device 70 is configured to periodically generate a pulsed negative direct-current voltage. FIG. 3 illustrates an example of a configuration of the direct-current power source device of the plasma processing apparatus shown in FIG. 2. FIG. 4 is a timing chart of a plasma processing method which is performed by using the plasma processing apparatus according to an exemplary embodiment. In FIG. 4, the horizontal axis represents time. In FIG. 4, the vertical axis represents supply of radio frequency power (the first radio frequency power and/or the second radio frequency power), and the output voltage of the direct-current power source device 70. In FIG. 4, a high level of radio frequency power indicates that the radio frequency power is being supplied. In FIG. 4, a low level of radio frequency power indicates that the radio frequency power is not supplied. Hereinafter, FIGS. 3 and 4 will be referred to together with FIG. 2.

In an embodiment, the direct-current power source device 70 includes a variable direct-current power source 70*a* and a switching device 70*b*. The variable direct-current power source 70*a* is configured to generate a negative direct-current voltage continuously. The level of the negative direct-current voltage which is output from the variable direct-current power source 70*a* may be controlled by a controller 80, which will be described later. The switching device 70*b* switches connection and disconnection between the variable direct-current power source 70*a* and the upper electrode 30 by switching of a conduction state thereof. The switching of the conduction state of the switching device 70*b* may be controlled by the controller 80.

In order to output the pulsed negative direct-current voltage, the output voltage of the direct-current power source device 70 is a negative direct-current voltage in a first period P1 in a cycle PT. In an embodiment, the conduction state of the switching device 70*b* is switched such that the variable direct-current power source 70*a* and the upper electrode 30 are connected to each other, in the first period P1 within the cycle PT. The output voltage of the direct-current power source device 70 is zero volts in the second period P2 remaining in the cycle PT. In an embodiment, the conduction state of the switching device 70*b* is switched such that connection between the variable direct-current power source 70*a* and the upper electrode 30 is disconnected, in the second period P2 within the cycle PT.

In an embodiment, a frequency f that is the reciprocal of the cycle PT may be 400 kHz or more. In an embodiment, the frequency f may be 1 MHz or less. In a case where the frequency f is 1 MHz or less, the independent controllability of the behavior of ions with respect to the generation of radicals in the chamber 10 is enhanced.

The plasma processing apparatus 1 further includes the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, the visualized operating status of the plasma processing apparatus 1 can be displayed by the display device. Further, a control program and recipe data are stored in the storage unit of the controller 80. The control program is executed by the processor of the controller 80 to perform various processing in the plasma processing apparatus 1. The processor of the controller 80 executes the control program and controls each part of the plasma processing apparatus 1 according to the recipe data, whereby the method MT is performed in the plasma processing apparatus 1.

Hereinafter, the method MT will be described with reference to FIG. 1 again, taking as an example a case where the method is performed using the plasma processing apparatus 1. Further, the control of each part of the plasma processing apparatus 1 by the controller 80 will also be described.

The method MT includes step ST1 and step ST2. During performing step ST1 and step ST2, a substrate (for example, a dummy substrate) may or may not be placed on the substrate support 14.

In step ST1, plasma is generated from a film formation gas in the chamber 10. In step ST1, the film formation gas is supplied from the gas supply unit GS into the chamber 10 in order to generate plasma from a film formation gas in the chamber 10. The film formation gas is a gas containing a raw material of a protective film to be formed on the inner wall surface 10*w*. The film formation gas may include a silicon-containing gas as a raw material gas. In this case, a silicon-containing film is formed as the protective film. The silicon-containing gas may be a silicon halide gas. The silicon halide gas may be a silicon tetrachloride gas. In step ST1, one or more other gases may be supplied into the chamber 10, in addition to the raw material gas. That is, in step ST1, a mixed gas containing the raw material gas may be supplied into the chamber 10. One or more other gases may be an oxygen gas and a noble gas (for example, an argon gas). In a case where the film formation gas contains an oxygen gas, a silicon oxide film is formed as the protective film. The film formation gas may include another raw material gas instead of the silicon-containing gas. For example, the film formation gas may include a carbon-containing gas as the raw material gas. In this case, a carbon-containing film is formed as the protective film. The carbon-containing gas may be a hydrocarbon gas such as a $CH_4$ gas, or a fluorocarbon gas such as a $C_4F_6$ gas. Further, in step ST1, the first radio frequency power and/or the second radio frequency power is supplied in order to form plasma from the film formation gas in the chamber 10. As a result, plasma is generated from the film formation gas in the chamber 10. In step ST1, the second radio frequency power may not be supplied.

For the execution of step ST1, the controller 80 controls the gas supply unit GS to supply the film formation gas into the chamber 10. For the execution of step ST1, the controller 80 controls the exhaust device 50 to set the pressure in the chamber 10 to a specified pressure. For the execution of the process ST1, the controller 80 controls the first radio frequency power source 62 and/or the second radio frequency power source 64 to supply the first radio frequency power and/or the second radio frequency power.

Step ST2 is performed during the generation of plasma in step ST1. In step ST2, a protective film is formed on the inner wall surface 10w by depositing the chemical species from the plasma generated from the film formation gas in step ST1 on the inner wall surface 10w. In step ST2, a pulsed negative direct-current voltage is periodically applied from the direct-current power source device 70 to the upper electrode 30. As described above, the output voltage of the direct-current power source device 70 is a pulsed negative direct-current voltage in the first period P1 within the cycle PT. The output voltage of the direct-current power source device 70 is zero volts in the second period P2 remaining within the cycle PT.

In an embodiment, the effective value of the output voltage of the direct-current power source device 70 in step ST2 is smaller than 0 V and equal to or larger than −848 V. The effective value is the product of the square root of a duty ratio (expressed as a decimal number) of the pulsed negative direct-current voltage and the value of the pulsed negative direct-current voltage in the first period P1. The duty ratio is the ratio (expressed as a decimal number) of the time length of the first period P1 to the time length of the cycle PT. In an embodiment, the duty ratio of the pulsed negative direct-current voltage may be 0.2 or more and 0.5 or less. In an embodiment, the value of the pulsed negative direct-current voltage in the first period P1 may be smaller than 0 V and equal to or larger than −1200 V.

For the execution of step ST2, the controller 80 controls the direct-current power source device to periodically apply a pulsed negative direct-current voltage to the upper electrode 30. In an embodiment, the controller 80 controls the direct-current power source device 70 to set the effective value of the output voltage of the direct-current power source device 70 to a value smaller than 0 V and equal to or larger than −848 V.

In the method MT, the raw material in the plasma formed from the film formation gas forms a protective film on the surface of the upper electrode 30 and the inner wall surface 10w of the side wall of the chamber 10. At the time of the formation of the protective film, the pulsed negative direct-current voltage is periodically applied to the upper electrode 30, and therefore, ion sputtering occurs on the protective film formed on the surface of the upper electrode 30. As a result, an increase in the thickness of the protective film formed on the surface of the upper electrode 30 is suppressed. On the other hand, the thickness of the protective film which is formed on the inner wall surface 10w is adjusted according to the effective value of the voltage which is applied from the direct-current power source device 70 to the upper electrode 30 when the protective film is formed. Therefore, according to the method MT, it becomes possible to control the thickness of the protective film which is formed on the inner wall surface 10w, while suppressing an increase in the thickness of the protective film which is formed on the upper electrode 30 of the capacitively coupled plasma processing apparatus 1.

In an embodiment, the method MT may further include step ST3. Step ST3 is performed after step ST2. In step ST3, plasma processing of the substrate is performed in the chamber 10. During performing step ST3, the substrate is placed on the substrate support 14 and held by the electrostatic chuck 20. The plasma processing which is performed in step ST3 may be plasma etching. The plasma processing which is performed in step ST3 may be another plasma processing.

In step ST3, a processing gas is supplied from the gas supply unit GS into the chamber 10. The processing gas is appropriately selected according to the plasma processing which is applied to the substrate. In step ST3, the first radio frequency power and/or the second radio frequency power is supplied in order to generate plasma from the processing gas in the chamber 10. As a result, plasma is generated from the processing gas in the chamber 10. In step ST3, the substrate is processed by the chemical species from the plasma generated from the processing gas. In step ST3, the effective value of the output voltage of the direct-current power source device 70 is set to a value smaller than the effective value in step ST2. As a result, the reduction of the protective film during the execution of step ST3 is suppressed.

For the execution of step ST3, the controller 80 controls the gas supply unit GS to supply the processing gas into the chamber 10. For the execution of step ST3, the controller 80 controls the exhaust device 50 to set the pressure in the chamber 10 to a specified pressure. For the execution of step ST3, the controller 80 controls the first radio frequency power source 62 and/or the second radio frequency power source 64 to supply the first radio frequency power and/or the second radio frequency power. Further, for the execution of step ST3, the controller 80 controls the direct-current power source device 70 to set the effective value of the output voltage of the direct-current power source device 70 to a value smaller than the effective value set in step ST2.

In an embodiment, the method MT may further include step ST4. In step ST4, the protective film formed in step ST2 is removed. During the execution of step ST4, a substrate (for example, a dummy substrate) may or may not be placed on the substrate support 14.

In step ST4, a cleaning gas is supplied from the gas supply unit GS into the chamber 10. In a case where the protective film is a silicon oxide film, the cleaning gas may include a fluorocarbon gas (for example, a $CF_4$ gas). In a case where the protective film is a carbon-containing film, the cleaning gas may include an oxygen-containing gas (for example, an $O_2$ gas). In step ST4, the first radio frequency power and/or the second radio frequency power is supplied to generate plasma from the cleaning gas in the chamber 10. As a result, plasma is generated from the cleaning gas in the chamber 10. In step ST4, the protective film is removed by the chemical species from the plasma generated from the cleaning gas. In step ST4, the effective value of the output voltage of the direct-current power source device 70 is set to a value larger than the effective value in step ST2. As a result, the efficiency of removing the protective film in step ST4 is improved.

For the execution of step ST4, the controller 80 controls the gas supply unit GS to supply the cleaning gas into the chamber 10. For the execution of step ST4, the controller 80 controls the exhaust device 50 to set the pressure in the chamber 10 to a specified pressure. For the execution of step ST4, the controller 80 controls the first radio frequency power source 62 and/or the second radio frequency power source 64 to supply the first radio frequency power and/or the second radio frequency power. Further, for the execution of step ST4, the controller 80 controls the direct-current power source device 70 to set the effective value of the output voltage of the direct-current power source device 70 to a value larger than the effective value set in step ST2.

In an embodiment, the method MT may further include step ST5. In step ST5, it is determined whether or not a stop condition is satisfied. It is determined that the stop condition is be satisfied, for example, in a case where the number of executions of the sequence including step ST1 to step ST4 has reached a predetermined number of times. In a case where it is determined in step ST5 that the stop condition is not satisfied, the sequence including step ST1 to step ST4 is further executed. In step ST3 in the sequence which is further executed, plasma processing is further executed on the substrate processed in step ST3 in the previous sequence, or plasma processing is executed on another substrate. In a case where it is determined in step ST5 that the stop condition is satisfied is made, the method MT is ended.

While various exemplary embodiments have been described above, various additions, omissions, substitutions and changes may be made without being limited to the exemplary embodiments described above. Elements of the different embodiments may be combined to form another embodiment.

Hereinafter, an experiment performed in order to evaluate the method MT and the plasma processing apparatus 1 will be described. It should be noted that the present disclosure is not limited by the experiment described below.

In the experiment, step ST1 and step ST2 were performed in a state where a first chip was attached to the surface on the internal space 10s side of the upper electrode 30, a second chip was attached to the first region 10a, and a third chip was attached to the second region 10b. In the experiment, the effective value of the output voltage of the direct-current power source device 70 in step ST2 was set to various values. The conditions of step ST1 in the experiment are shown below.

Conditions of Step ST1

Pressure in chamber 10: 20 mTorr (2.666 Pa)
Flow rate of silicon tetrachloride gas: 5 sccm
Flow rate of oxygen gas: 50 sccm
Flow rate of argon gas: 250 sccm
First radio frequency power: 60 MHz, 1000 W
Second radio frequency power: 0 W
Frequency f (reciprocal of cycle PT): 400 kHz
Duty ratio of pulsed negative direct-current voltage: 0.3 or 0.5
Value of pulsed negative direct-current voltage: 0 V, −500 V, or −900 V In the experiment, the thickness of the protective film formed on each chip under each setting of the effective value of the output voltage of the direct-current power source device 70 was measured. Then, the ratio of the film thickness of the protective film formed on each chip to a reference film thickness, that is, a film thickness ratio (percentage), was obtained. Here, the reference film thickness is the film thickness of the protective film formed on a chip attached to the same location when the effective value of the output voltage of the direct-current power source device 70 in step ST2 is 0 V.

Figure 5:
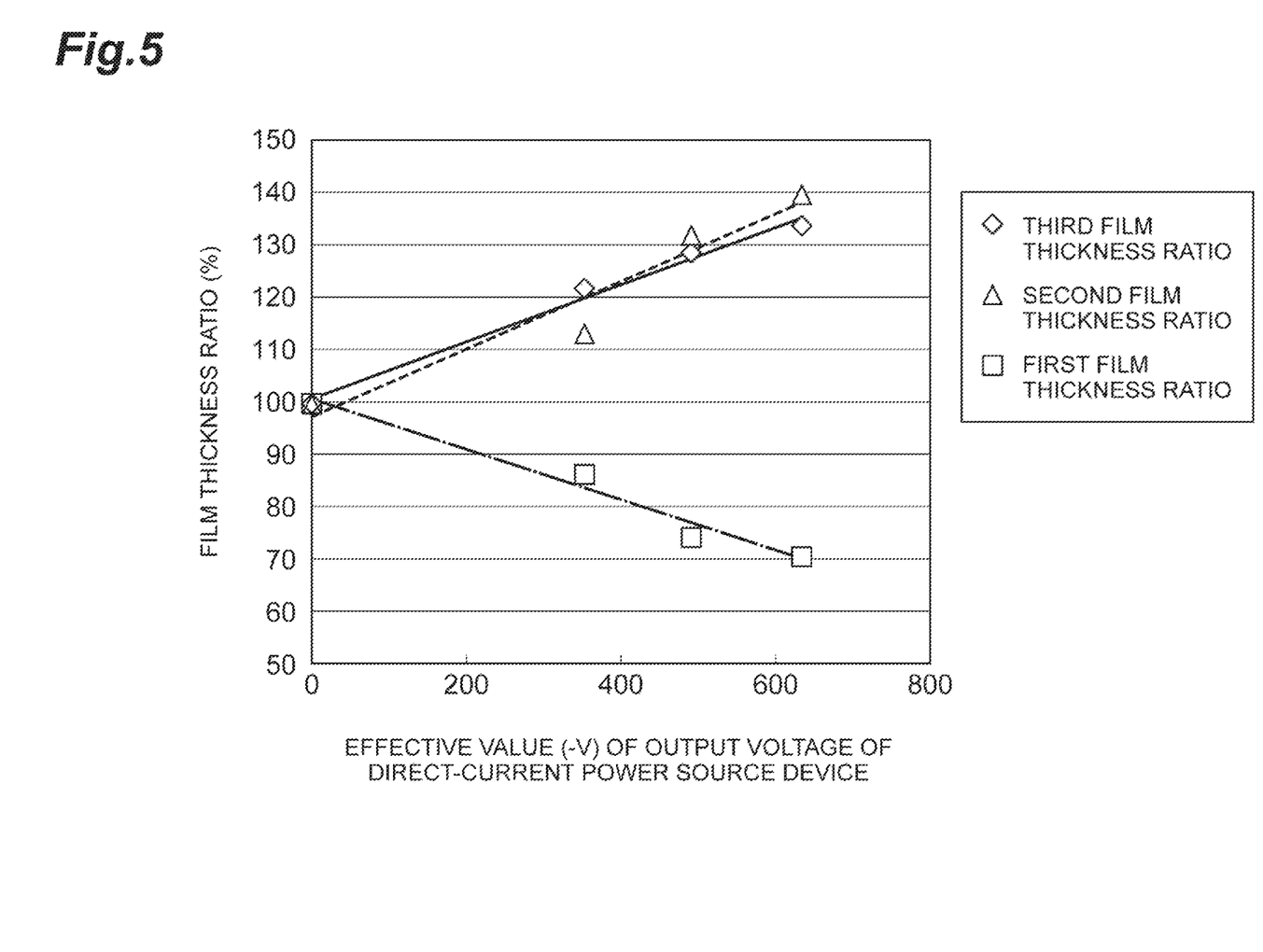
FIG. 5 is a graph showing experimental results.

FIG. 5 shows a graph showing the results of the experiment. In the graph of FIG. 5, the horizontal axis represents the effective value of the output voltage of the direct-current power source device 70 in step ST2. In the graph of FIG. 5, the vertical axis represents the obtained film thickness ratio. In FIG. 5, first to third film thickness ratios indicate the film thickness ratios of the protective films formed on the first to third chips, respectively. As shown in FIG. 5, the first film thickness ratio decreases as the absolute value of the effective value of the output voltage of the direct-current power source device 70 increases. From this, it is confirmed that an increase in the film thickness of the protective film which is formed on the surface of the upper electrode 30 can be suppressed by periodically applying a pulsed negative direct-current voltage from the direct-current power source device 70 to the upper electrode 30 during the generation of the plasma of the film formation gas. Further, it is confirmed that the film thickness of the protective film which is formed on the surface of the upper electrode 30 decreases as the absolute value of the effective value of the output voltage of the direct-current power source device 70 increases.

On the other hand, as shown in FIG. 5, the second film thickness ratio and the third film thickness ratio increase as the absolute value of the effective value of the output voltage of the direct-current power source device 70 increases. From this, it is confirmed that the film thickness of the protective film which is formed on the inner wall surface 10w of the side wall of the chamber 10 can be adjusted according to the effective value of the voltage which is applied from the direct-current power source device 70 to the upper electrode when the protective film is formed.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method performed using a plasma processing apparatus, wherein the plasma processing apparatus includes:
   a chamber including a side wall having an inner wall surface;
   a substrate support including a lower electrode provided in the chamber;
   an upper electrode provided above the substrate support;
   a radio frequency power source for generating plasma in the chamber; and
   a direct-current power source device electrically connected to the upper electrode, the direct-current power source device being configured to generate a pulsed negative direct-current voltage periodically at a cycle, the cycle including a first period and a second period which is an entire remaining period in the cycle,
   the plasma processing method comprising:
   generating plasma from a film formation gas in the chamber by supplying radio frequency power from the radio frequency power source; and
   forming a protective film on the inner wall surface by depositing a chemical species from the plasma of the film formation gas on the inner wall surface, wherein
   in said forming a protective film, the pulsed negative direct-current voltage is applied from the direct-current power source device to the upper electrode in the first period and an output voltage of the direct-current power source device is set to zero volts in the second period, whereby the pulsed negative direct-current voltage is applied from the direct-current power source device to the upper electrode in periodically at the cycle.

2. The plasma processing method according to claim 1, wherein
a frequency which is a reciprocal of the cycle is 400 kHz or more and 1 MHz or less.

3. The plasma processing method according to claim 1, wherein
the film formation gas includes a silicon-containing gas or a carbon-containing gas, an oxygen gas, and a noble gas.

4. The plasma processing method according to claim 1, wherein
a duty ratio of the pulsed negative direct-current voltage is 0.2 or more and 0.5 or less.

5. The plasma processing method according to claim 1, further comprising
sputtering ions to the protective film formed on a surface of the upper electrode, by applying the pulsed negative direct-current voltage to the upper electrode in said forming a protective film.

6. The plasma processing method according to claim 1, wherein
a thickness of the protective film formed on the inner wall surface is adjusted according to an effective value of the output voltage which is applied from the direct-current power source device to the upper electrode in said forming a protective film.

7. The plasma processing method according to claim 1, wherein
the pulsed negative direct-current voltage is applied to the upper electrode after a start of supplying the radio frequency power.

8. The plasma processing method according to claim 1, wherein
the film formation gas includes a carbon-containing gas.

9. The plasma processing method according to claim 8, wherein
the carbon-containing gas is a hydrocarbon gas or a fluorocarbon gas.

10. The plasma processing method according to claim 1, wherein
the film formation gas includes a silicon-containing gas.

11. The plasma processing method according to claim 10, wherein
the silicon-containing gas is a silicon halide gas.

12. The plasma processing method according to claim 11, wherein
the silicon halide gas is a silicon tetrachloride gas.

13. The plasma processing method according to claim 1, wherein
an effective value of the output voltage of the direct-current power source device in said forming a protective film is smaller than 0 V and equal to or larger than −848 V, and
the effective value is a product of a square root of a duty ratio and a value of the pulsed negative direct-current voltage in the first period, the duty ratio being a ratio of a time length of the first period to a time length of the cycle.

14. The plasma processing method according to claim 13, further comprising
performing plasma processing on a substrate in the chamber after said forming a protective film, wherein
in said performing plasma processing,
plasma is generated from a processing gas in the chamber by supplying radio frequency power from the radio frequency power source,
the effective value of the output voltage of the direct-current power source device is set to a value smaller than the effective value in said forming a protective film, and
the substrate is processed by a chemical species from the plasma generated from the processing gas.

15. The plasma processing method according to claim 13, further comprising removing the protective film, wherein
in said removing the protective film,
plasma is generated from a cleaning gas in the chamber by supplying radio frequency power from the radio frequency power source,
the effective value of the output voltage of the direct-current power source device is set to a value larger than the effective value in the said forming a protective film, and
the protective film is processed by a chemical species from the plasma generated from the cleaning gas.

16. The plasma processing method according to claim 15, wherein
the cleaning gas includes a fluorocarbon gas and an oxygen-containing gas.

17. The plasma processing method according to claim 13, further comprising
performing plasma processing on a substrate in the chamber after said forming a protective film, wherein
in said performing plasma processing,
plasma is generated from a processing gas in the chamber by supplying radio frequency power from the radio frequency power source to etch the substrate placed on the substrate support by a chemical species from the plasma generated from the processing gas,
the pulsed negative direct-current voltage is applied from the direct-current power source device to the upper electrode periodically at the cycle during generation of the plasma from the processing gas to etch the substrate, and
the effective value of the output voltage of the direct-current power source device is set to a value smaller than the effective value in said forming a protective film.

18. The plasma processing method according to claim 17, further comprising
removing the protective film after said performing plasma processing, wherein
in said removing the protective film,
plasma is generated from a cleaning gas in the chamber by supplying radio frequency power from the radio frequency power source,
the pulsed negative direct-current voltage is applied from the direct-current power source device to the upper electrode periodically at the cycle during generation of the plasma from the cleaning gas to remove the protective film by a chemical species from the plasma generated from the cleaning gas, and
the effective value of the output voltage of the direct-current power source device is set to a value larger than the effective value in the said forming a protective film.

19. A plasma processing apparatus comprising:
a chamber including a side wall having an inner wall surface;
a substrate support including a lower electrode provided in the chamber;
an upper electrode provided above the substrate support;
a radio frequency power source for generating plasma in the chamber;
a direct-current power source device electrically connected to the upper electrode; and
a controller configured to control the radio frequency power source and the direct-current power source device, wherein
the direct-current power source device is configured to generate a pulsed negative direct-current voltage periodically at a cycle, the cycle including a first period and a second period which is an entire remaining period in the cycle, and
the controller is configured to
control the radio frequency power source to supply radio frequency power to generate plasma from a film formation gas in the chamber, and
control the direct-current power source device to apply the pulsed negative direct-current voltage to the upper electrode in the first period and to set an output voltage of the direct-current power source device to zero volts in the second period, thereby periodically applying the pulsed negative direct-current voltage to the upper electrode to form a protective film on the inner wall surface by depositing a chemical species from the plasma of the film formation gas on the inner wall surface.

* * * * *